(12) United States Patent
Jauhiainen et al.

(10) Patent No.: US 10,023,957 B2
(45) Date of Patent: Jul. 17, 2018

(54) APPARATUS AND METHOD FOR PROCESSING SUBSTRATE

(71) Applicant: BENEQ OY, Espoo (FI)

(72) Inventors: Mika Jauhiainen, Jyväskylä (FI); Pekka Soininen, Helsinki (FI)

(73) Assignee: BENEQ OY, Espoo (FI)

( * ) Notice: Subject to any disclaimer, the term of this patent is extended or adjusted under 35 U.S.C. 154(b) by 0 days.

(21) Appl. No.: 14/405,958

(22) PCT Filed: Jul. 8, 2013

(86) PCT No.: PCT/FI2013/050739
§ 371 (c)(1),
(2) Date: Dec. 5, 2014

(87) PCT Pub. No.: WO2014/009606
PCT Pub. Date: Jan. 16, 2014

(65) Prior Publication Data
US 2015/0167164 A1    Jun. 18, 2015

(30) Foreign Application Priority Data

Jul. 9, 2012  (FI) ...................................... 20125786

(51) Int. Cl.
*C23C 16/455*  (2006.01)
*C23C 16/458*  (2006.01)
*C23C 16/54*  (2006.01)

(52) U.S. Cl.
CPC ...... *C23C 16/45544* (2013.01); *C23C 16/458* (2013.01); *C23C 16/45551* (2013.01);
(Continued)

(58) Field of Classification Search
None
See application file for complete search history.

(56) References Cited

U.S. PATENT DOCUMENTS 4,354,455 A * 10/1982 Looney ................ C23C 16/455
                                                  118/680
4,501,310 A *  2/1985 Valdes ................ A01G 23/091
                                                  144/24.13
(Continued)

FOREIGN PATENT DOCUMENTS

JP    A-55-120142    9/1980
JP    A-4-171944     6/1992
(Continued)

OTHER PUBLICATIONS

"Chapter 10: Mechanisms Which Provide Oscillating Motion" in Holbrook L. Horton, Ed. "Ingenious Mechanisms for Designers and Inventors—vol. III." Industrial Press Inc. 1951. pp. 246-281.*
(Continued)

*Primary Examiner* — Jeffrie R Lund
*Assistant Examiner* — Stanislav Antolin
(74) *Attorney, Agent, or Firm* — Robert P. Michal, Esq.; Carter, DeLuca, Farrell & Schmidt, LLP

(57) ABSTRACT

The present invention relates to an apparatus and method for processing a surface of a substrate by subjecting the surface to successive surface reactions of a first and second precursor. The apparatus includes a nozzle head having two or more precursor nozzles and a moving mechanism for moving the nozzle head in non-linear oscillating movement in a first and second movement direction between a first extreme position and a second extreme position via a center position. The moving mechanism includes first driving means for accelerating the nozzle head in the first moving direction and decelerating the nozzle head in the second moving direction and second driving means for accelerating the nozzle head in the second moving direction and decelerating the nozzle head in the first moving direction.

14 Claims, 4 Drawing Sheets

(52) U.S. Cl.
CPC ...... *C23C 16/45563* (2013.01); *C23C 16/545* (2013.01); *C23C 16/45517* (2013.01); *C23C 16/45525* (2013.01); *C23C 16/45574* (2013.01); *C23C 16/54* (2013.01)

(56) References Cited

U.S. PATENT DOCUMENTS

| | | | | |
|---|---|---|---|---|
| 4,928,625 | A * | 5/1990 | Woods | B05B 13/04 118/323 |
| 5,072,534 | A * | 12/1991 | Kodet | G09F 11/18 40/438 |
| 6,074,484 | A * | 6/2000 | Higuti | B05B 13/005 118/305 |
| 6,675,548 | B2 * | 1/2004 | Bristol | B24C 1/06 239/11 |
| 8,453,593 | B1 * | 6/2013 | Weisenberg | B05B 7/16 118/50 |
| 8,962,094 | B2 * | 2/2015 | Taylor | B05B 7/0408 427/449 |
| 2002/0003207 | A1 * | 1/2002 | Fang | H04N 1/0402 250/234 |
| 2002/0187730 | A1 * | 12/2002 | Bristol | B24C 1/06 451/36 |
| 2003/0112924 | A1 * | 6/2003 | Seufert | G21K 1/04 378/160 |
| 2004/0013225 | A1 * | 1/2004 | Gregerson | A61B 6/032 378/19 |
| 2004/0104515 | A1 * | 6/2004 | Swanson | B29C 41/36 264/497 |
| 2005/0268856 | A1 * | 12/2005 | Miller | C23C 16/45544 118/729 |
| 2006/0106302 | A1 * | 5/2006 | Takamori | G01R 33/28 600/415 |
| 2007/0058212 | A1 * | 3/2007 | Beselt | H04N 1/04 358/474 |
| 2007/0281106 | A1 * | 12/2007 | Lubomirsky | C23C 16/401 427/569 |
| 2008/0011892 | A1 * | 1/2008 | D'Agnolo | B65H 54/2821 242/125 |
| 2008/0217541 | A1 * | 9/2008 | Kim | G01T 1/1644 250/363.09 |
| 2008/0292058 | A1 * | 11/2008 | Nagata | G21K 1/04 378/152 |
| 2009/0081886 | A1 * | 3/2009 | Levy | C23C 16/45551 438/790 |
| 2009/0314391 | A1 * | 12/2009 | Crump | B22F 3/1055 148/523 |
| 2010/0148517 | A1 * | 6/2010 | Duclos | F03G 3/06 290/1 C |
| 2010/0209614 | A1 * | 8/2010 | Sakata | H01L 21/02 427/402 |
| 2011/0097493 | A1 | 4/2011 | Kerr et al. | |
| 2011/0311716 | A1 * | 12/2011 | Taylor | B05B 7/0408 427/8 |
| 2013/0078073 | A1 * | 3/2013 | Comb | F16H 19/06 414/749.1 |
| 2013/0149446 | A1 * | 6/2013 | Soininen et al. | 427/248.1 |
| 2013/0199446 | A1 * | 8/2013 | Alasaarela | C23C 16/45544 118/715 |
| 2013/0256551 | A1 * | 10/2013 | Yao | A61N 5/1082 250/393 |
| 2015/0096495 | A1 * | 4/2015 | Jeong | C23C 16/4412 118/729 |
| 2015/0184295 | A1 * | 7/2015 | Jeong | C23C 16/45551 427/255.28 |

FOREIGN PATENT DOCUMENTS

| | | | | |
|---|---|---|---|---|
| JP | A-2010-66298 | | 3/2010 | |
| KR | 20130142860 A | * | 12/2013 | ....... C23C 16/45565 |
| KR | 101435100 B1 | * | 8/2014 | ....... C23C 16/45565 |
| WO | WO 2011056359 A1 | * | 5/2011 | ......... C23C 16/4401 |
| WO | WO 2012/028771 A1 | | 3/2012 | |
| WO | WO 2012028771 A1 | * | 3/2012 | ....... C23C 16/45544 |
| WO | WO 2012028779 A1 | * | 3/2012 | ....... C23C 16/45551 |
| WO | WO 2013191469 A1 | * | 12/2013 | ....... C23C 16/45548 |
| WO | WO 2013191471 A1 | * | 12/2013 | ....... C23C 16/45551 |

OTHER PUBLICATIONS

"Chapter 10: Mechanisms Which Provide Oscillating Motion" in John A. Newell et al., Eds. "Ingenious Mechanisms for Designers and Inventors—vol. IV." Industrial Press Inc. 1967. pp. 245-264.*
Search Report issued in Finnish Application No. 20125786 dated May 2, 2013.
International Search Report issued in PCT/FI2013/050739 dated Dec. 3, 2013.
Written Opinion of the International Searching Authority issued in PCT/FI2013/050739 completed Dec. 2, 2013.

* cited by examiner

APPARATUS AND METHOD FOR PROCESSING SUBSTRATE

FIELD OF THE INVENTION

The present invention relates to an apparatus for processing a surface of a substrate by subjecting the surface of a substrate to successive surface reactions of at least a first precursor and a second precursor. The present invention further relates to a method for processing a surface of a substrate by subjecting the surface of a substrate to successive surface reactions of at least a first precursor and a second precursor.

BACKGROUND OF THE INVENTION

In the prior art several types of apparatuses, and nozzle heads are used for subjecting a surface of a substrate to successive surface reactions of at least a first precursor and a second precursor according to the principles of atomic layer deposition method (ALD). In ALD applications, typically two gaseous precursors are introduced into the ALD reactor in separate stages. The gaseous precursors effectively react with the substrate surface, resulting in deposition of a single atomic layer. The precursor stages are typically followed or separated by a purge stage that eliminates the excess precursor from the surface of the substrate prior to the separate introduction of the other precursor. Therefore an ALD process requires alternating in sequence the flux of precursors to the surface of the substrate. This repeated sequence of alternating surface reactions and purge stages between is a typical ALD deposition cycle.

The prior art ALD-apparatuses usually comprise a nozzle head having one or more first precursor nozzles for subjecting the surface of the substrate to the first precursor, one or more second precursor nozzles for subjecting the surface of the substrate to the second precursor. Furthermore, one or more purge gas nozzles or purge gas zones may be arranged between the first and second precursor zones for subjecting the surface of the substrate to a purge gas. When the nozzle head is moved in relation to the substrate surface it will produce growth layers according to the principles of ALD method. The nozzle head may also comprise discharge channels arranged between the first and second precursor zone or between a first precursor zone and a purge gas zone or between a second precursor zone and a purge gas zone. The discharge channels may are arranged to exhaust precursor and purge gas after the surface of the substrate is subjected to it. Alternatively each of these prior art precursor nozzles and purge gas zones may comprise at least one inlet port for supplying the precursor or purge gas and at least one outlet port for exhausting the precursor or purge gas. Thus there is provided suction to each of the zones for exhausting the precursor or purge gas after the substrate is subjected to it.

As only one atomic layer is produced on the surface of the substrate during one ALD-cycle, the nozzle head is formed to comprise several first and second zones such that a single scan with the nozzle head over the surface of the substrate forms several atomic layers on the surface of the substrate. The single scan with the nozzle head may be done by moving either the nozzle head or the substrate or both the nozzle head and the substrate. In the prior art the number of scan with the nozzle head is increasing by moving the nozzle head in a movement path with a moving mechanism using fast speed for performing multiple scans over the surface of the substrate. The moving of the nozzle head may be performed with a linear back and forth movement or with a non-linear oscillating movement between a first and second extreme positions, such as pendulum movement under the influence of gravitation.

The prior art apparatuses and methods for producing several atomic layer has the disadvantage that the back and forth movement with the moving mechanism produces great mechanical forces the nozzle head has to stand. The forces are especially high as the nozzle head has be stopped in the end position and accelerated again. Therefore the apparatus and the nozzle head are susceptible to damages as the acceleration and deceleration are carried by a motor. Furthermore, the oscillating back and forth movement between the end positions requires accelerating the nozzle head over and over again which consumes a lot of energy. The non-linear oscillating pendulum movement has the disadvantage that the pendulum frequency and the circumferential velocity are determined by the length of the pendulum rod. In industrial applications the length of the pendulum rod has to be formed rather large for providing industrially feasible apparatuses and for providing sufficient pendulum amplitude. The great length of the pendulum rod cause slow pendulum frequency which on the other hand limits the velocity in which the substrate can be moved in relation to the nozzle head. Increasing the pendulum frequency by supplying power through the pendulum axis produces great mechanical forces and subjects the pendulum axis and the pendulum rod and respective connections to damages. Accordingly the prior art apparatus do not provide industrially applicable construction for moving the nozzle head in a reliable manner.

BRIEF DESCRIPTION OF THE INVENTION

An object of the present invention to provide an apparatus and a method so as to overcome or at least alleviate the above mentioned prior art problems.

The preferred embodiments of the invention are disclosed in the dependent claims.

The invention is based on the idea of providing an apparatus for processing a surface of a substrate by subjecting the surface of a substrate to successive surface reactions of at least a first precursor and a second precursor. The apparatus comprising at least one nozzle head having two or more precursor nozzles for subjecting the surface of the substrate to at least the first and second precursors. The nozzle head is moved with a moving mechanism in non-linear oscillating between a first extreme position and a second extreme position via a centre position. According to the present invention the moving mechanism comprises first driving means and second driving means connected to the nozzle head for controlling in co-operation the non-linear oscillating movement between the first and second extreme positions. The moving mechanism may be arranged to move the nozzle head in a circular or rotational oscillating movement around an oscillation axis between the first extreme position and the second extreme position. In one embodiment the first driving means may be arranged to accelerate the nozzle head towards the first extreme position and decelerate the nozzle head towards the second extreme position, and that the second driving means are arranged to accelerate the nozzle head towards the second extreme position and decelerate the nozzle head towards the first extreme position. Furthermore, in one embodiment the first driving means may be arranged to accelerate the nozzle head between the second extreme position and the centre position and decelerate the nozzle head between the centre position and the second extreme position, and that the second driving means are arranged to accelerate the nozzle head between the first extreme position and the centre position and decelerate the nozzle head between the centre position and the first extreme position.

In one embodiment the nozzle head is moved using an electric motor, servomotor, spring drive, pneumatic drive, magnetic field drive or a combination of two or more thereof mechanically and operatively connected directly to the nozzle head with transmission means. The nozzle head is further connected to an oscillation axis with a pendulum rod for forming a pendulum in which the nozzle head is provided as a pendulum mass for moving the nozzle head by oscillating pendulum movement using the driving means. In an alternative embodiment the nozzle head may also be moved in oscillating rotational movement between the first and second extreme positions.

The present invention further provides a method for processing a surface of a substrate by subjecting the surface of a substrate to successive surface reactions of at least a first precursor and a second precursor. The method comprises subjecting the surface of the substrate to at least the first and second precursor with a nozzle head arranged over the surface of the substrate and provided with at least one first precursor nozzle for supplying the first precursor and at least one second precursor nozzle for supplying the second precursor and moving the nozzle head over the surface of the substrate in non-linear oscillating movement between a first extreme position and a second extreme position. The method further comprises accelerating the nozzle head towards the first extreme position and decelerating the nozzle head towards the second extreme position with the first driving means and accelerating the nozzle head towards the second extreme position and decelerating the nozzle the towards first extreme position with second driving means for controlling the non-linear oscillating movement of the nozzle head.

An advantage of the present invention is that the oscillating frequency may be without subjecting the apparatus to excessive mechanical stresses as the accelerating and decelerating of the nozzle head may be carried out by using two separate driving means in alternating manner. This enables to smoothly accelerate and decelerate the nozzle head during oscillating movement and further prevent damages. Furthermore, the present invention may be used for controlling pendulum frequency of oscillating pendulum movement of the nozzle head. Therefore, the pendulum frequency may be increased without shortening the pendulum rod or providing power through the pendulum axis. Accordingly the velocity of the nozzle head may be increased without subjecting the nozzle head to excessive mechanical forces. Therefore, also the substrate may be moved faster and the predetermined coating thickness may be achieved more efficiently.

BRIEF DESCRIPTION OF THE DRAWINGS

In the following the invention will be described in greater detail by means of preferred embodiments with reference to the accompanying drawings, in which.

DETAILED DESCRIPTION OF THE INVENTION

Figure 1:
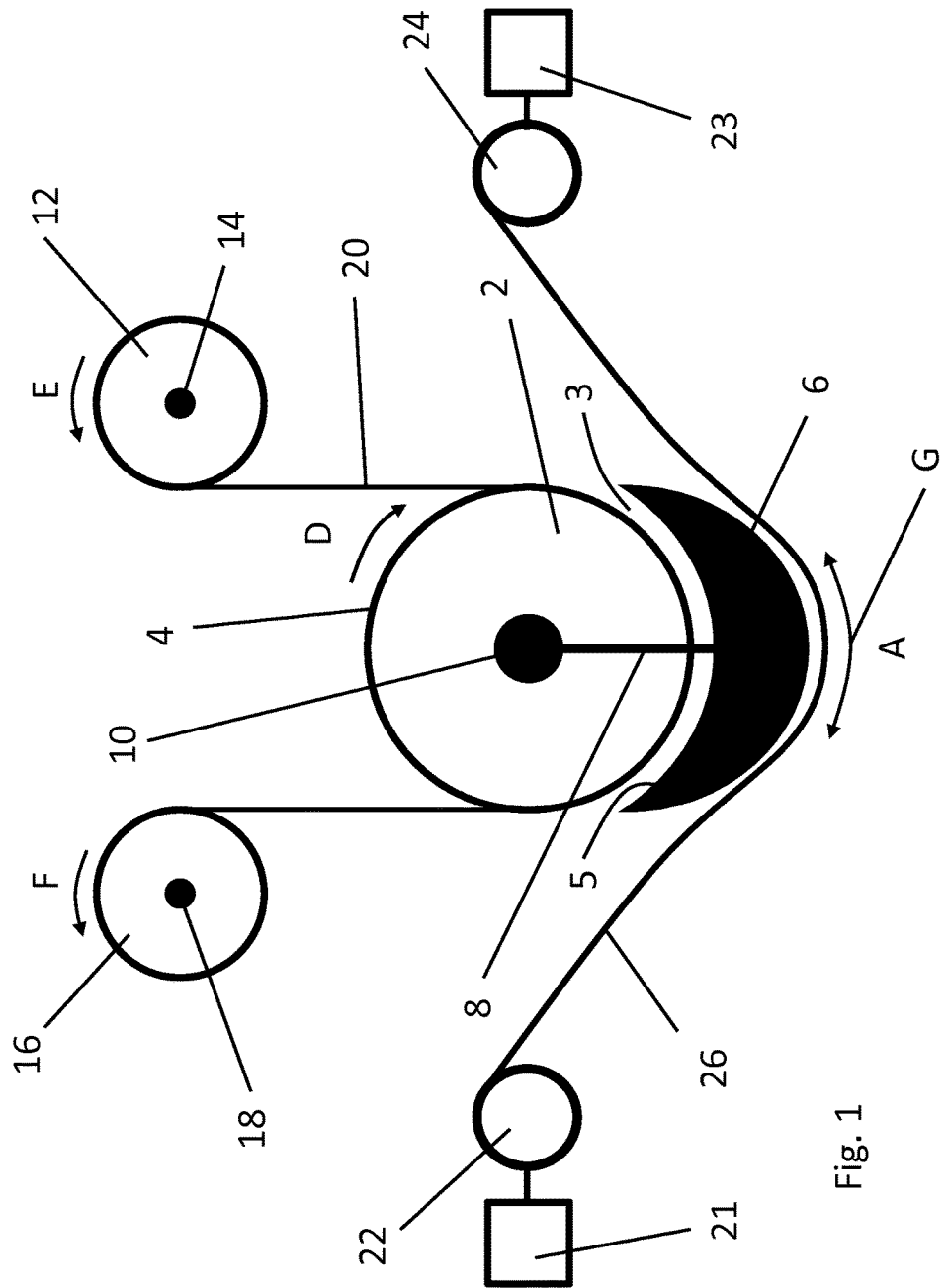
FIG. 1 shows one embodiment of an apparatus according to the present invention in which the nozzle head is in a centre position of pendulum movement.

FIG. 1 shows schematically one embodiment of the apparatus of the present invention. The apparatus comprises a transport cylinder 2 having a circular or cylindrical outer surface 4. The apparatus may also comprise only one or more than two transport cylinders 2. The transport cylinder 2 may be stationary or alternatively they may rotate around a central axis 10 of the transport cylinder 2 in direction of arrow D. As shown in FIG. 1 a substrate 20 is transported along a transport path such that the substrate 20 is transported along at least a part of the outer surface 4 of the transport cylinder 2. In FIG. 1 the substrate 20 is supplied from a first substrate roll 12 to the transport cylinder 2 and further to a second substrate roll 16. The first and second substrate roll 12, 16 may also be replaced by some other kind of receptacle for supplying, receiving and storing elongated substrate 20. The first and second substrate roll 12, 16 are preferably rotated around their central axels 14, 18 in the direction of arrows E and F, respectively, for transporting the elongated substrate 20 from the first substrate roll 12 to the second substrate roll 16 via the transport cylinder 2. The transport cylinder 2 forms substrate support and the outer surface 4 substrate support surface on which the substrate 20 is supported during processing.

The flexible substrate 20 may be any elongated and flexible substrate. The present invention however is not restricted to any type of substrate, but the substrate 20 and the moving nozzle head may be any kind placed over the substrate 20. In this context the substrate 20 means a substrate itself or a powder like, particle like or separate parts or objects installed on an elongated and flexible substrate carrier or another substrate carrier. The precursors used may comprise any precursors suitable for atomic layer deposition, such as ozone, TMA (trimethylaluminium), water, $TiCl_4$, DEZ (diethylzinc), or precursor may also be plasma, such as $NH_3$, Ar, $O_2$, $N_2$, $H_2$ or $CO_2$ plasma. Purge gas may comprise inert gas, such as nitrogen, dry air, or any other gas suitable to be used as purge gas in atomic layer deposition. Also plasma may be used for purging, for example nitrogen or argon plasma. In that this context purge gases and precursors comprise also plasma.

In FIG. 1 the substrate 20 is shown to be transported about 180 degrees on the outer surface 4 of the transport cylinder 2. However, it should be noted that the substrate 20 may also be transport only 45 degrees or more, preferably 90 degrees or even at least a sector of 270 degrees or more along the outer surface 4 of the transport cylinder 2. The substrate 20 may be transported along the outer surface 4 of the transport cylinder 2 by rotating the transport cylinder 2 with a same speed as substrate 20 is transported. Alternatively the transport cylinder 2 is provided with a sliding surface on the outer surface 4 of the transport cylinder 2 such that the substrate 20 may slide along the outer surface 4. In an alternative embodiment the outer surface 4 of the transport cylinder 2 is provided with one or more transport elements (not shown) for guiding the substrate 20 along the outer surface 4 and enhancing the movement of the substrate 20. The transport elements may are formed as transport rollers extending substantially in the direction of the central axis of the transport cylinder 2. The transport rollers may be freely rotating rollers or driven rollers. The transport element may also be for example a conveyor belt rotating around outer surface 4 of the transport cylinder 2. It should be noted that in this context a cylindrical cylinder or a cylindrical surface mean also slightly conical cylinders. In other words the cylinder may comprise a narrow part for example in the middle of the transport cylinder 2 for guiding a substrate 20.

The apparatus is further provided with a nozzle head 6. The nozzle head 6 is arranged in connection with the transport cylinder 2. However, it is also possible to arrange two or more nozzle heads 6 in connection with the transport cylinder 2. The two or more nozzle heads 6 may be arranged in parallel or in series relative to the each other, in other words adjacent to each other or in succession. The nozzle head 6 comprises an output face 5 from which the process gases are supplied and exhausted. In this context the output face 5 means the surface of the nozzle head 6 which is towards the substrate 20. The output face 5 also means the part of the surface towards the substrate which comprises process gas nozzles and discharge channels. The precursors and purge gas may be supplied to the nozzle head 6 via fluid connections. Alternatively the nozzle head 6 is provided with one or more precursor and/or purge gas containers, bottles or the like such that the precursors and/or the move together with the nozzle head 6. This arrangement decreases the number of difficult fluid connections in a moving nozzle head 6.

The output face 5 of the nozzle head 6 is formed to conform at least a portion of a cylindrical outer surface 4, as shown in FIG. 1. In other words the output face 5 is formed as concave surface or an arc surface cut off from a cylindrical surface. The output face 5 is further formed such that it may be positioned over, above or on the transport surface 4. Therefore the output face 5 is formed to substantially conform the transport surface 4. This means that the output face 5 and the transport surface 4 preferably have substantially same shape. The nozzle head 6 is positioned such that there is gap 3 between the output face 5 and the transport surface 4, or the surface of the substrate 20. The elongated substrate 20 is arranged to be transported in this gap between the output face 5 and the transport surface 4, such that a predetermined process gap or distance 3 is formed between the nozzle head 6, or the output face 5, and the surface of the substrate 20. Thus when substrate 20 is transported on the transport surface 4, the substrate 20 and the output face 5 form together a reaction space. In a preferred embodiment the output face 5 is positioned at a substantially constant distance from the transport surface 4, or the surface of the substrate 20 along the length of the transport surface 4. This is achieved such that the transport cylinder 2 has a first radius and the output face 5 of the nozzle head 6 has a second radius larger than the first radius, and they have a common central axis 10. Thus the output face 5 of the nozzle head 6 and the outer surface 4 of the transport cylinder 2 are arranged coaxially for providing a substantially constant predetermined distance 3 between the outer surface 4 and the output face 5. As shown in FIG. 1, the output face 5 of nozzle head 6 is arranged to process the substrate 20 substantially along the whole sector on which the substrate 20 is transported along the outer surface 4 of the transport cylinder 2. In an alternative embodiment the output face 5 of the nozzle head 4 is arranged to process the substrate 20 only along a part of the sector on which the substrate 20 is transported along the outer surface 4 of the transport cylinder 2.

The apparatus comprises a nozzle head moving mechanism for supporting and moving the nozzle head 6 at the predetermined distance 3 from the substrate support surface 4 or the surface of the substrate 20. In the embodiment of FIG. 1 the nozzle head moving mechanism comprises one or more nozzle head support members 8 for positioning and holding the nozzle head 6 in place over the substrate 6. In this embodiment the support member 8 are support rods connected to the central axis 10 of the transport cylinder 2 or a separate nozzle head axis arranged coaxially with the central axis 10 of the transport cylinder 2. The nozzle head 6 is supported to the central axis 10 with the support rod 8 such that the nozzle head 6 may be moved in oscillating pendulum or swing movement around the central axis 10. The nozzle head 6 is provided to one end of the support rod 8 and the other end of the support rod is connected to the oscillation axis 10. In other words the nozzle head 6 is supported rotationally to the transport cylinder 2 such that it may be moved in the directions of arrow G. The nozzle head 6 may be arranged to freely move in relation to the transport cylinder 2 such that the transport cylinder 2 and the nozzle head 6 may be moved independently from each other. In this embodiment the nozzle head 6 is connected to the oscillation axis 10 with the pendulum rod 8 for forming a pendulum in which the nozzle head 6 is provided as a pendulum mass for moving the nozzle head 6 by oscillating pendulum movement.

The nozzle head 6 is moved with the moving means in oscillating pendulum movement between a first and second extreme positions via a centre position. The nozzle head 6 is shown in the centre position A in FIG. 1. In this embodiment the centre position A forms the dead point of the pendulum movement in which the direction of the acceleration is changed. In this embodiment the oscillation axis 10 is arranged substantially horizontally such that the nozzle head 6 moves in pendulum movement against gravitation. However in an alternative embodiment the oscillation axis substantially vertically for providing a torsion pendulum is which the pendulum rod 8 is rotated in oscillating movement for moving the nozzle head 6. The torsion pendulum may comprise two or more nozzle heads 6 and the output face 5 may be provided substantially horizontally for supplying precursors upwards or downwards.

Figure 2:
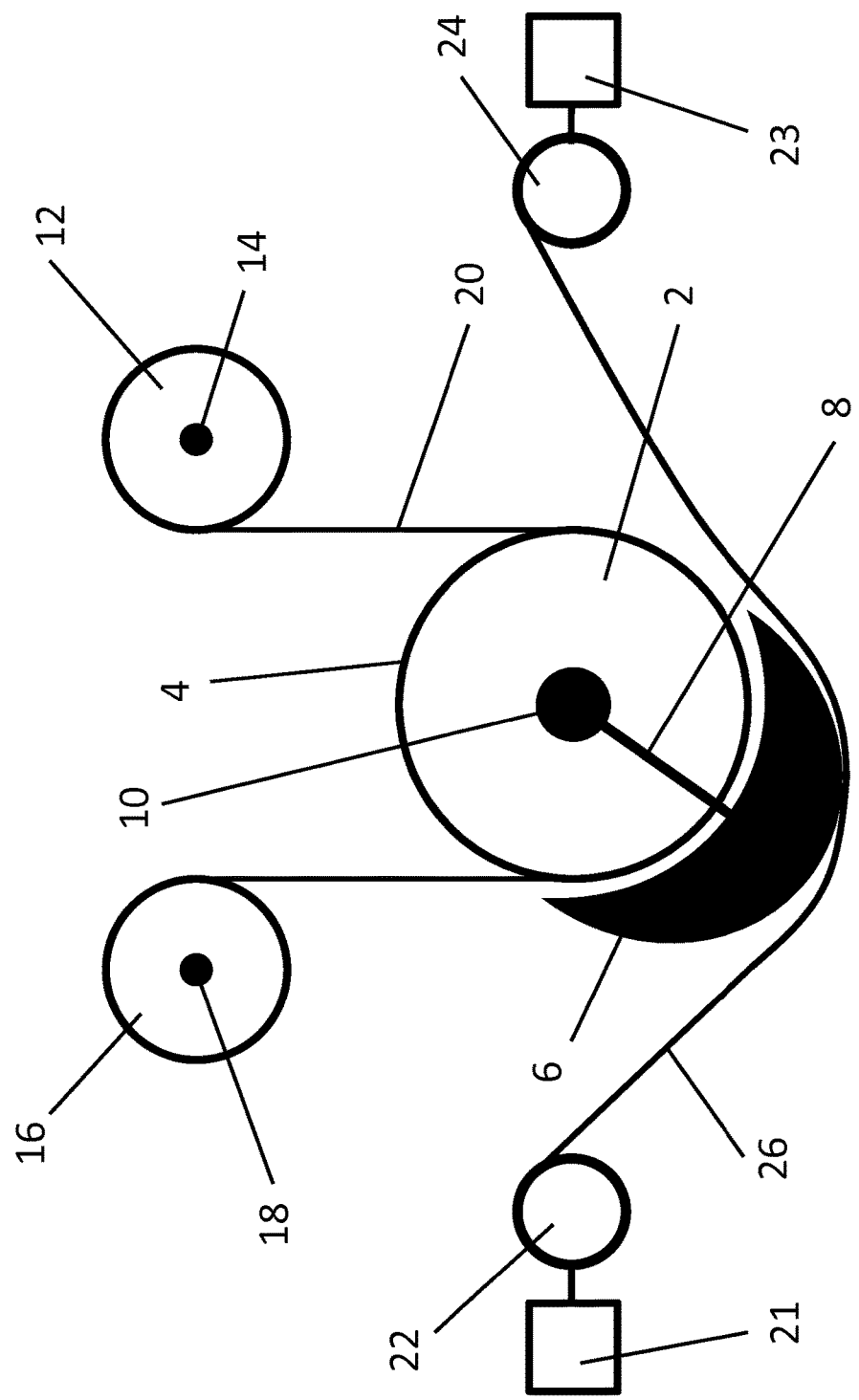
FIG. 2 shows the apparatus of FIG. 1 with the nozzle head in a first extreme position of pendulum movement.
Figure 3:
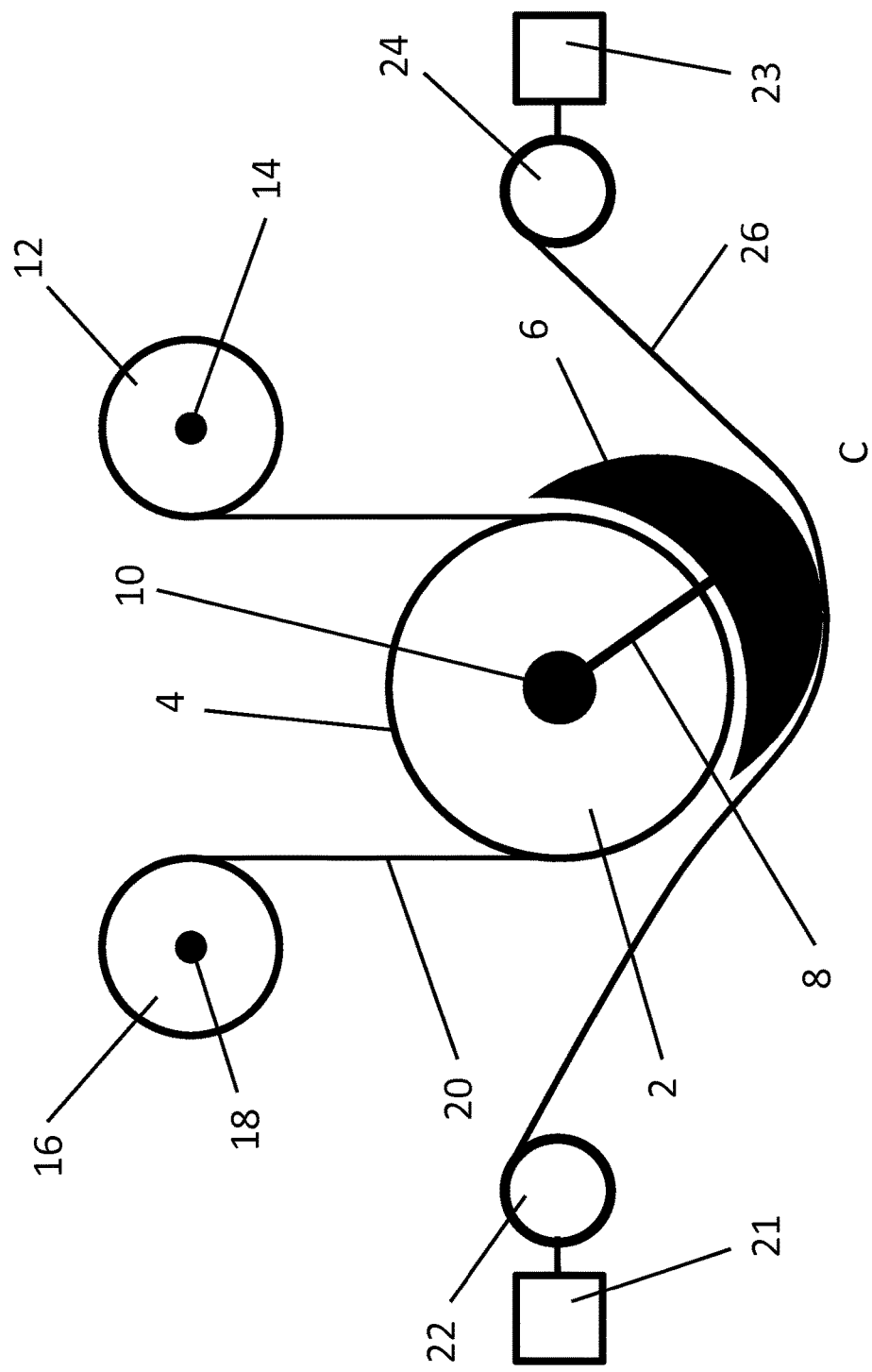
FIG. 3 shows the apparatus of FIG. 1 with the nozzle head in a second extreme position of pendulum movement.

FIGS. 2 and 3 show the nozzle head 6 in the first extreme position B and in the second extreme position C, respectively. Accordingly the nozzle head 6 is moved in oscillating pendulum movement between the first and second extreme positions B, C such that the nozzle head 6 moves via the centre position A between the extreme positions. This means that the moving mechanism is arranged to move the nozzle head 6 in an oscillating swing movement between the first extreme position B and the second extreme position C around the oscillation axis 10, as shown in FIG. 1. The nozzle head 6 is arranged to the end of support rod 8. As shown in FIG. 1 the nozzle head 6 forms the weight of the pendulum, or the pendulum mass. In an alternative embodiment a separate weight may be connected to the nozzle head 6 for providing or enhancing the swinging movement of the nozzle head 6. Thus the nozzle head 6 is arranged to move by pendulum movement at a substantially constant distance 3 from the outer surface 4 of the transport cylinder 2, as shown with arrow G in FIG. 1.

For maintaining constant pendulum movement of then nozzle head 6, movement power has to be provided to the nozzle head 6 as friction and some other resistance tends to diminish the pendulum movement. Therefore the moving mechanism of the nozzle head 6 according to the present invention comprises first driving means 21, 22 and second driving means 23, 24 for providing movement power to the nozzle head for maintaining the constant pendulum movement and/or controlling the oscillation frequency and oscillation amplitude of the nozzle head 6. As shown in FIG. 1 the drive means comprise at least one first power supply unit 21 and the second drive means comprise at least one second power unit 23 for providing movement power to the nozzle head 6. According to the basic principle of the present invention the first and second drive means and the power units 21, 23 are operatively connected directly to the nozzle head 6, in other words to the pendulum mass. This means that the movement power is not supplied via the oscillation axis 10, which would cause large mechanical stresses. In the embodiment of FIGS. 1, 2 and 3 the first and second power units 21, 23 are connected to the nozzle head 6 mechanically and operatively connected directly to the nozzle head 6 with transmission means 22, 24, 26. In the embodiment of FIGS. 1 to 3 the transmission means comprise belt 26 connected between drive wheels 22, 24. The first end of the belt 26 is connected to the first drive wheel 22 which is further operatively connected to the first power unit 21. The second end of the belt 26 is connected to the second drive wheel 24 which is further operatively connected to the second power unit 23. The power units 21, 23 are arranged to rotate the drive wheels 22, 24 such that the belt may be moved between the drive wheels 22, 24. The belt 26 may thus be coiled on the drive wheels 22, 24 for moving the belt 26. The belt 26 is further connected to the nozzle head 6 such that the movement of the belt 26 moved the nozzle head 6 in oscillating pendulum movement between the first and second extreme positions B, C in the direction of arrow G. The belt 26 may be connected or attached to the nozzle head 6 with any known attachment means or it may be connected to the nozzle head 6 only with friction such that the belt 26 is supported on the surface of the nozzle head 6. The belt may be a metal belt, textile belt or belt formed from some other known material. It should be noted that the belt 26 may also be replaced with two separate belts such that one belt is provided between the first drive wheel 22 and the nozzle head 6 and the second belt between the second drive wheel 24 and the nozzle head 6. Furthermore, the drive wheels 22, 24 may be replaced with some other drive members. The belt 26 may also be replaced with one or more lever assemblies, chains, gear wheels or other power transmission means. The transmission means may be connected between the first and second power units 21, 23 or separately between the first power unit 21, or the first drive means, and the nozzle head 6 and the second power unit 23, or the second drive means, and the nozzle head 6.

The first and second power supply units 21, 23 may comprise an electric motor, servomotor, spring drive, pneumatic drive, magnetic field drive or a combination of two or more thereof for providing oscillation power to the nozzle head 6. In some embodiments the power supply units 21, 23 may also be arranged to store at least part of the kinetic energy of the nozzle head 6 released in oscillating movement of the nozzle head 6 and further utilize it for further move the nozzle head 6. The kinetic energy may be stored for example using spring assemblies, batteries, flywheels or the like. The nozzle head 6 may be accelerated from the second extreme position C towards the centre position A by providing moving power with the first driving means 21, 22. When the nozzle head 6 moves from the centre position A towards the first extreme position B the nozzle may be decelerated with the second driving 23, 24. The nozzle head 6 is further accelerated from the first extreme position B towards the centre position with the second driving means 23, 24 and decelerated with the first driving means 21, 22 when it moves from the centre position A towards the second extreme positions. Thus the first and second driving means are used at least mainly in alternating manner. This way the pendulum frequency of the nozzle head 6 may be increased from the natural pendulum frequency determined by the length of the pendulum rod 8 and gravitation.

As shown in FIGS. 1 to 3 the nozzle head 6 is connected to the oscillation axis 10 with the pendulum rod 8 for forming a pendulum in which the nozzle head 6 is provided as a pendulum mass for moving the nozzle head by oscillating pendulum movement. The oscillation axis 10 is arranged substantially horizontally for moving the nozzle head 6 in pendulum movement against gravitation and the drive means 21, 22, 23, 24 are used for controlling and providing the power for the pendulum movement. The apparatus further comprises a transport cylinder 2 having an outer surface 4 along which a flexible elongated substrate 20 is transported and the nozzle head 6 arranged to move by oscillating pendulum movement at a substantially constant distance from the outer surface 4 of the transport cylinder 2 between the first and second extreme positions B, C. The nozzle head 6 is rotationally supported with the pendulum rod 8 to the central axis of the transport cylinder 2 such that the central axis of the transport cylinder 2 forms the oscillating axis 10.

Figure 4:
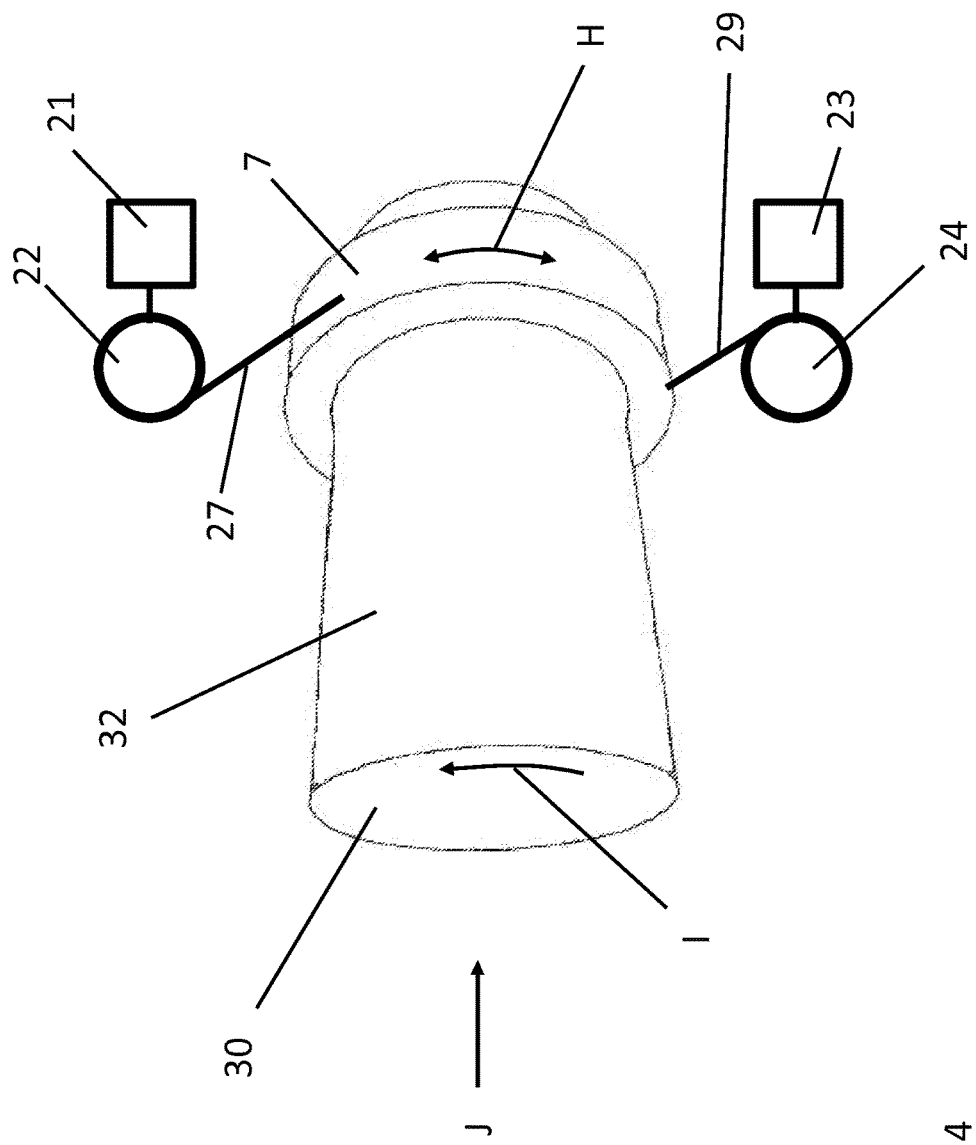
FIG. 4 shows another embodiment of an apparatus according to the present invention.

FIG. 4 shows schematically another embodiment according to the present invention. The apparatus for processing at least partly cylindrical surface comprises a nozzle head 7. In FIG. 4 the nozzle head 7 is a hollow cylinder having a central axis and substantially circular circumference wall. The circumference wall has an inner surface and an outer surface. In the embodiment of FIG. 4 the inner surface of the circumference wall is the output face of the nozzle head 7. The precursors are supplied through the output face for subjecting the surface 32 of a substrate 30 to precursors. The nozzle head 7 is thus arranged to process an outer surface 32 of cylindrical substrate 30 such that the cylindrical substrate 30 may be moved through the hollow nozzle head 7, as shown in FIG. 4. However, in an alternative embodiment the output face of the nozzle head 7 may also be the outer surface of the cylindrical nozzle head 7. The output face of the cylindrical nozzle head 7 is provided with one or more first precursor nozzles for subjecting the surface 32 cylindrical substrate 30 to the a first precursor, and one or more second precursor nozzles for subjecting the surface 32 of the cylindrical object 30 to the second precursor. The precursor nozzles may be arranged to extend in the direction of the central axis of the cylindrical nozzle head 7 adjacent to each other in the inner output face. The cylindrical substrate 30 may be rotated around the longitudinal axis in the direction of arrow I in FIG. 4, such that the surface 32 of the substrate 7 is subjected to the first and second precursor. The nozzle head 2 is also rotated around the central axis of the cylindrical nozzle head 7. The apparatus of FIG. 4 comprises a moving mechanism arranged to rotate the nozzle head 7 around the central axis in oscillating movement between a first and second extreme positions. This means that the nozzle head 7 is rotated successively a predetermined angle to opposite directions around the central oscillation axis. The moving mechanism substantially corresponds the moving mechanism of FIGS. 1 to 3, therefore the same features are not described, but they may be applied in both constructions and also in other corresponding apparatuses in which non-linear, or circular, oscillating movement of the nozzle head is used. The movement mechanism comprises first driving means 21, 22 and second driving means 23, 24 for providing movement power to the nozzle head 7 for providing, controlling and maintaining a constant oscillation movement and/or oscillation frequency and oscillation amplitude of the nozzle head 7. As shown in FIG. 4 the drive means comprise at least one first power supply unit 21 and the second drive means comprise at least one second power unit 23 for providing movement power to the nozzle head 6. According to the basic principle of the present invention the first and second drive means and the power units 21, 23 are operatively connected directly to the nozzle head 7, in other words to the oscillating mass. This means that the movement power is not supplied via the oscillation axis, or the central axis of the nozzle head 7, which would cause large mechanical stresses. In the embodiment of FIG. 4 the first and second power units 21, 23 are connected to the nozzle head 6 mechanically and operatively connected directly to the nozzle head 6 with transmission means 22, 24, 27, 29. In the embodiment of FIG. 4 the transmission means comprise belts 27, 29 connected between nozzle head 7 and drive wheels 22, 24. The first belt 26 is connected to the first drive wheel 22 which is further operatively connected to the first power unit 21. The second belt 29 is connected to the second drive wheel 24 which is further operatively connected to the second power unit 23. The power units 21, 23 are arranged to rotate the drive wheels 22, 24 such that the belts 27, 29 may be moved thus coiled on the drive wheels 22, 24 for moving nozzle head 7 in rotational oscillating movement in the directions of arrow H. It should be noted that the belts 27, 29 may also be replaced with only one separate belt, as discussed in connection with FIGS. 1 to 3. The belts 27, 29 may also be replaced with one or more lever assemblies, chains, gear wheels or other power transmission means. The transmission means may be connected between the first and second power units 21, 23 or separately between the first power unit 21, or the first drive means, and the nozzle head 7 and the second power unit 23, or the second drive means, and the nozzle head 7. The nozzle head 7 of FIG. 4 may be arranged to rotate 45 degrees of more, preferably 180 or more or even over 360 degrees. The nozzle head 7 and the substrate 30, or substrate carrier, may also be moved linearly in relation to each other in the direction of arrow J, such that the substrate 30 may be moved through the nozzle head 7. As shown in FIG. 4 the drive means 21, 22, 23, 24 are arranged to provide oscillating rotation movement to the nozzle head 7 by providing torsion to the nozzle head 7. The torsion is provided by connecting the first and second drive means on substantially opposite sides of the nozzle head 7 such that the movement power may be provided tangentially to the nozzle head 7. The moving mechanism may thus be arranged to rotate the nozzle head 7 around a rotation axis by an oscillating rotational movement between the first and second extreme positions B, C. Therefore, the nozzle head 7 and the moving mechanism form a torsion pendulum having substantially horizontal oscillation axis. In another embodiment the oscillation axis may be substantially vertical and the nozzle head may also be some other kind of nozzle head.

According to the present invention the moving mechanism comprises the first driving means 21, 23 for accelerating the nozzle head 6, 7 towards the first extreme position B and decelerating the nozzle head 6 towards the second extreme position and second driving means 23, 24 for accelerating the nozzle head 6 towards the second extreme position and decelerating the nozzle head 6, 7 towards the first extreme position. In the present invention the moving mechanism is arranged to move the nozzle head 6, 7 in a circular or rotating oscillating movement around the oscillation axis between the first extreme position B and the second extreme position C. The first and second driving means are arranged to operate in co-operation such that they both may be efficiently used during one complete pendulum cycle in which the nozzle head moves from the centre position A back to the centre position A via the first and second extreme positions B, C. In one embodiment the first and second driving means are used in cooperation such that the first driving means 21, 22 are arranged to accelerate the nozzle head 6 towards the first extreme position B and decelerate the nozzle head 6, 7 towards the second extreme position C, and that the second driving means 23, 24 are arranged to accelerate the nozzle head 6, 7 towards the second extreme position C and decelerate the nozzle head 6, 7 towards the first extreme position B. In one embodiment the first driving means 21, 22 are arranged to accelerate the nozzle head 6, 7 between the second extreme position C and the centre position A towards the first extreme position B and decelerate the nozzle head 6, 7 between the centre position A and the second extreme position C towards the second extreme position C, and that the second driving means 23, 24 are arranged to accelerate the nozzle head 6, 7 between the first extreme position B and the centre position A towards the second extreme position C and decelerate the nozzle head 6, 7 between the centre position A and the first extreme position B towards the first extreme position B. Therefore, the mechanical stresses subjected to the nozzle head 6, 7 and the apparatus may be minimized and the oscillation frequency easily controlled also in industrial size applications.

The present invention further relates to a method for processing a surface of a substrate by subjecting the surface of a substrate to successive surface reactions of at least a first precursor and a second precursor. The surface of the substrate is subjected to at least the first and second precursor with a nozzle head arranged over the surface of the substrate and provided with at least one first precursor nozzle for supplying the first precursor and at least one second precursor nozzle for supplying the second precursor. The nozzle head is moved over the surface of the substrate in non-linear oscillating movement between a first extreme position and a second extreme position. The present invention comprises accelerating the nozzle head towards the first extreme position B and decelerating the nozzle head towards the second extreme position with first driving means and accelerating the nozzle head towards the second extreme position C and decelerating the nozzle head towards the first extreme position with second driving means for controlling the non-linear oscillating movement of the nozzle head in co-operation with the first and second driving means. The nozzle head may be moved by oscillating pendulum movement between the first and second extreme positions or by an oscillating circular or rotational movement between the first and second extreme positions B, C.

It will be obvious to a person skilled in the art that, as the technology advances, the inventive concept can be implemented in various ways. The invention and its embodiments are not limited to the examples described above but may vary within the scope of the claims.

The invention claimed is:

1. An apparatus for processing a surface of a substrate by subjecting the surface of a substrate to successive surface reactions of at least a first precursor and a second precursor, the apparatus comprising:
   a transport cylinder for transporting the substrate along at least part of the outer surface of the transport cylinder;
   at least one nozzle head in fluid communication with the transport cylinder, an inner surface of at least one nozzle head having two or more precursor nozzles for subjecting the surface of the substrate to at least the first and second precursors, the nozzle head is provided as an oscillating mass; and a moving mechanism for moving the oscillating mass in a circular oscillating movement between a first extreme position and a second extreme position via a centre position, the moving mechanism being arranged to move the nozzle head provided as the oscillating mass in circular oscillating movement around an oscillation axis between the first extreme position and the second extreme position, wherein the moving mechanism comprises:
first driving means and second driving means to mechanically communicating with the nozzle head provided as the oscillating mass and arranged to control in co-operation the circular oscillating movement around the oscillation axis between the first and second extreme positions,
a transmission means arranged between the first and second driving means, with the transmission means frictionally engaging the outer surface of the nozzle head, and
a rod connected to the nozzle head provided as the oscillating mass for moving the nozzle head by oscillating movement using the first and second driving means,
wherein the first driving means is arranged to accelerate the nozzle head towards the first extreme position and decelerate the nozzle head towards the second extreme position with the transmission means, and the second driving means is arranged to accelerate the nozzle head towards the second extreme position and decelerate the nozzle head towards the first extreme position with the transmission means for controlling the frequency of the circular oscillating movement.

2. An apparatus according to claim 1, wherein the first driving means is arranged to accelerate the nozzle head between the second extreme position and the centre position and decelerate the nozzle head between the centre position and the second extreme position, and the second driving means is arranged to accelerate the nozzle head between the first extreme position and the centre position and decelerate the nozzle head between the centre position and the first extreme position.

3. An apparatus according to claim 1, wherein the first driving means comprise at least one first power supply unit providing the accelerating and decelerating power to the nozzle head for maintaining the non-linear oscillating movement of the nozzle head, and the second driving means comprise at least one second power supply unit providing the accelerating and decelerating power to the nozzle head for maintaining the non-linear oscillating movement of the nozzle head.

4. An apparatus according to claim 3, wherein the first and second power supply unit comprise at least one of an electric motor, servomotor, spring drive, pneumatic drive, magnetic field drive for providing oscillation power to the nozzle head.

5. An apparatus according to claim 3, wherein the first and second power supply units are mechanically and operatively connected directly to the nozzle head with the transmission means.

6. An apparatus according to claim 5, wherein the transmission means comprise one or more belts, lever assemblies, chains or gear wheels.

7. An apparatus according to claim 6, wherein the transmission means are operatively connected between the first and second power supply unit with a first and second drive wheel.

8. An apparatus according to claim 6, wherein the transmission means comprise a metal belt arranged between the first and second driving means and connected to nozzle head.

9. An apparatus according to claim 1, wherein the nozzle head is connected to an oscillation axis with a pendulum rod for forming a pendulum in which the nozzle head is provided as a pendulum mass for moving the nozzle head by oscillating pendulum movement.

10. An apparatus according to claim 9, wherein the oscillation axis is arranged substantially horizontally for moving the nozzle head in pendulum movement against gravitation, or the oscillation axis is arranged substantially vertically for providing a torsion pendulum for moving the nozzle head.

11. An apparatus according to claim 9, wherein the apparatus comprises a transport cylinder having an outer surface along which a flexible elongated substrate is transported, and the nozzle head arranged to move by oscillating pendulum movement at a substantially constant distance from the outer surface of the transport cylinder between the first and second extreme positions.

12. An apparatus according to claim 11, wherein the nozzle head is rotationally supported with the pendulum rod to the central axis of the transport cylinder such that the central axis of the transport cylinder forms the oscillating axis.

13. An apparatus according to claim 1, wherein the moving mechanism is arranged to rotate the nozzle head around a rotation axis by an oscillating rotational movement between the first and second extreme positions.

14. An apparatus according to claim 13, wherein the nozzle head is formed as a cylindrical nozzle head having a central axis and a substantially circular circumference at a constant distance from a central axis, and that the moving mechanism is arranged to rotate the nozzle head around the central axis of the nozzle head by an oscillating rotational movement between the first and second extreme positions.

* * * * *